(12) United States Patent
Song et al.

(10) Patent No.: US 8,599,630 B2
(45) Date of Patent: *Dec. 3, 2013

(54) SEMICONDUCTOR INTEGRATED CIRCUIT INCLUDING COLUMN REDUNDANCY FUSE BLOCK

(75) Inventors: Keun Soo Song, Ichon-shi (KR); Nak Kyu Park, Ichon-shi (KR)

(73) Assignee: SK hynix Inc. (KR)

( * ) Notice: Subject to any disclaimer, the term of this patent is extended or adjusted under 35 U.S.C. 154(b) by 129 days.

This patent is subject to a terminal disclaimer.

(21) Appl. No.: 13/179,355

(22) Filed: Jul. 8, 2011

(65) Prior Publication Data

US 2011/0267910 A1    Nov. 3, 2011

Related U.S. Application Data

(63) Continuation-in-part of application No. 12/345,974, filed on Dec. 30, 2008, now Pat. No. 8,077,531.

(30) Foreign Application Priority Data

Jan. 16, 2008   (KR) .................. 10-2008-0004850
Dec. 4, 2008    (KR) .................. 10-2008-122599

(51) Int. Cl.
    *G11C 29/00*    (2006.01)
(52) U.S. Cl.
    USPC ........................ 365/200; 365/225.7

(58) Field of Classification Search
    USPC ................... 365/200, 225.7, 230.03
    See application file for complete search history.

(56) References Cited

U.S. PATENT DOCUMENTS

| | | | | |
|---|---|---|---|---|
| 5,933,382 A | * | 8/1999 | Yi et al. | 365/225.7 |
| 6,205,063 B1 | * | 3/2001 | Aipperspach et al. | 365/200 |
| 6,426,902 B1 | * | 7/2002 | Lee et al. | 365/200 |
| 8,077,531 B2 | * | 12/2011 | Song et al. | 365/200 |
| 2007/0280012 A1 | * | 12/2007 | Obayashi et al. | 365/200 |

FOREIGN PATENT DOCUMENTS

| | | |
|---|---|---|
| JP | 06012891 A | 1/1994 |
| JP | 2004119965 A | 4/2004 |
| JP | 2004527907 A | 9/2004 |
| KR | 1020000028825 A | 5/2000 |

* cited by examiner

*Primary Examiner* — Huan Hoang
(74) *Attorney, Agent, or Firm* — Baker & McKenzie LLP

(57) ABSTRACT

A semiconductor integrated circuit includes a column redundancy fuse block having a fuse set array having a plurality of fuse sets including a plurality of column address fuses, and a fuse blowing information block configured to output a fuse blowing determination signal of a corresponding column based on a cutting state of the column address fuses, wherein the column redundancy fuse is disposed in the edge area, wherein the fuse blowing determination signal is inputted to a column control block through upper portion of a memory cell array of a corresponding bank.

18 Claims, 11 Drawing Sheets

SEMICONDUCTOR INTEGRATED CIRCUIT INCLUDING COLUMN REDUNDANCY FUSE BLOCK

CROSS-REFERENCES TO RELATED APPLICATION

This application is a continuation-in-part of U.S. patent application Ser. No. 12/345,974, filed Dec. 30, 2008, titled "SEMICONDUCTOR INTEGRATED CIRCUIT INCLUDING COLUMN REDUNDANCY FUSE BLOCK," which is hereby incorporated herein by reference, and which claims priority under 35 U.S.C. 119(a) to Korean application numbers 10-2008-0004850 and 10-2008-122599, filed on Jan. 16, 2008 and Dec. 4, 2008, respectively, in the Korean Intellectual Property Office, which are hereby incorporated herein by reference in their entirety as if set forth in full.

BACKGROUND

1. Technical Field

The embodiments described herein relate to a semiconductor integrated circuit, and more particularly, to a semiconductor integrated circuit including a column redundancy fuse block.

2. Related Art

As the scaled size of semiconductor integrated circuits are reduced, the number of devices integrated in a single semiconductor chip has increased. Accordingly, the defect density of the devices also increases, thereby lowering product yield of semiconductor devices. In extreme cases, a wafer used for manufacturing the semiconductor devices must be discarded.

In order to reduce the defect density, a redundancy circuit is used to exchange defective cells with extra replacement cells. In the semiconductor devices, a redundancy circuit (or fuse circuit) can be installed corresponding to row interconnections, i.e., word lines, and column interconnections, i.e., bit lines, and may include a fuse set array for storing address information of the defective cell. The fuse set array includes a plurality of fuse sets having a plurality of fuse interconnections, wherein a program for each fuse set can be executed through a selective laser cutting (or blowing).

FIG. 1 is a plan view of a conventional semiconductor chip. In FIG. 1, a column redundancy circuit block Y-Fuse is installed in a column control block 20 to relieve the column interconnections. Here, the column control block 20 is installed between banks that are adjacent to each other in the column direction.

FIG. 2 is a block diagram of a conventional redundancy circuit unit of a semiconductor chip. In FIG. 2, the column control block 20 includes a main decoder (not shown), a predecoder 21, and a redundancy circuit unit 23.

The main decoder (not shown) is a circuit for assigning an address position, and the predecoder 21 is a circuit for generating a column selection signal by receiving a column address signal. The redundancy circuit unit 23 includes a fuse circuit unit 25 and a fuse set array 27. The fuse circuit unit 25 provides redundancy selection information to the predecoder 21 based on the fuse cutting of the fuse set array 27. Here, reference numerals 10 and 30 represent a chip and a pad area, respectively.

However, in a semiconductor device, energy (for instance, laser) is applied after a semiconductor chip has been fabricated to prevent interconnections or layers from being formed on an upper portion of a fuse set (not shown) such that the interconnections are prevented from being influenced during the fuse blowing. For this reason, data input/output interconnections are configured to detour the upper portion of the fuse set. Thus, there are limitations in the layout of the interconnections and the circuits.

In addition, although an integration density and a process technology of the semiconductor device have been improved, a pitch between fuses is not sufficiently reduced due to the laser alignment tolerance, so that the area of the fuse set array 27, i.e., an area occupied by the fuses in the semiconductor chip, may be increased. This makes it difficult to ensure the effective net die of the semiconductor chip.

In particular, the fuse circuit unit 25 and the fuse set array 27 must be aligned in a space dedicated for the redundancy circuit unit 23, so that the fuse sets constituting the fuse set array 27 must be aligned in the multi-layer structure. For this reason, the area of the column control block 20 is enlarged, so that the area of the bank cannot be increased.

SUMMARY

A semiconductor integrated circuit capable of improving the alignment efficiency is described herein.

In one aspect, a semiconductor integrated circuit includes a semiconductor chip having an edge area and a bank area located an inner portion of the edge area, and a column redundancy fuse block disposed in the edge area. The column redundancy fuse block has a fuse set array having a plurality of fuse sets including a plurality of column address fuses, and fuse blowing information block configured to output a fuse blowing determination signal of a corresponding column based on a cutting state of the column address fuse, wherein column redundancy fuse is disposed in the edge area and the fuse blowing determination signal is inputted to a column control block through upper portion of a memory cell array of a corresponding bank.

In another aspect, a semiconductor integrated circuit includes a semiconductor chip having an edge area and a bank area located an inner portion of the edge area, a plurality of banks being arranged in the bank area along row and column directions at a regular interval, a column redundancy fuse block having a fuse set array disposed in the edge area substantially parallel to the row direction and a fuse blowing information block for detecting fuse blowing information in the fuse set array, and a column control block disposed in the bank area between the plurality of banks that are adjacent to each other along the column direction to output one of a column selection signal and a spare column selection signal by determining redundancy based on an output signal of the fuse blowing information block, wherein the output signal of the fuse block is inputted to the column control block through upper portions of the memory cell array of a corresponding bank.

In another aspect, a semiconductor integrated circuit includes an edge area having a column redundancy fuse block, a first bank disposed at a lower portion of the edge area, a first column control block disposed at a lower portion of the first bank, a second bank disposed at a lower portion of the first column control block, a second column control block disposed at a lower portion of the second bank, a fuse set array having a plurality of fuse sets including a plurality of column address fuses, and a fuse blowing information block configured to output a fuse blowing determination signal of a corresponding column based on a cutting state of the column address fuses, the fuse blowing determination signal is inputted to the column control block through upper portion of a memory cell array of a corresponding bank.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
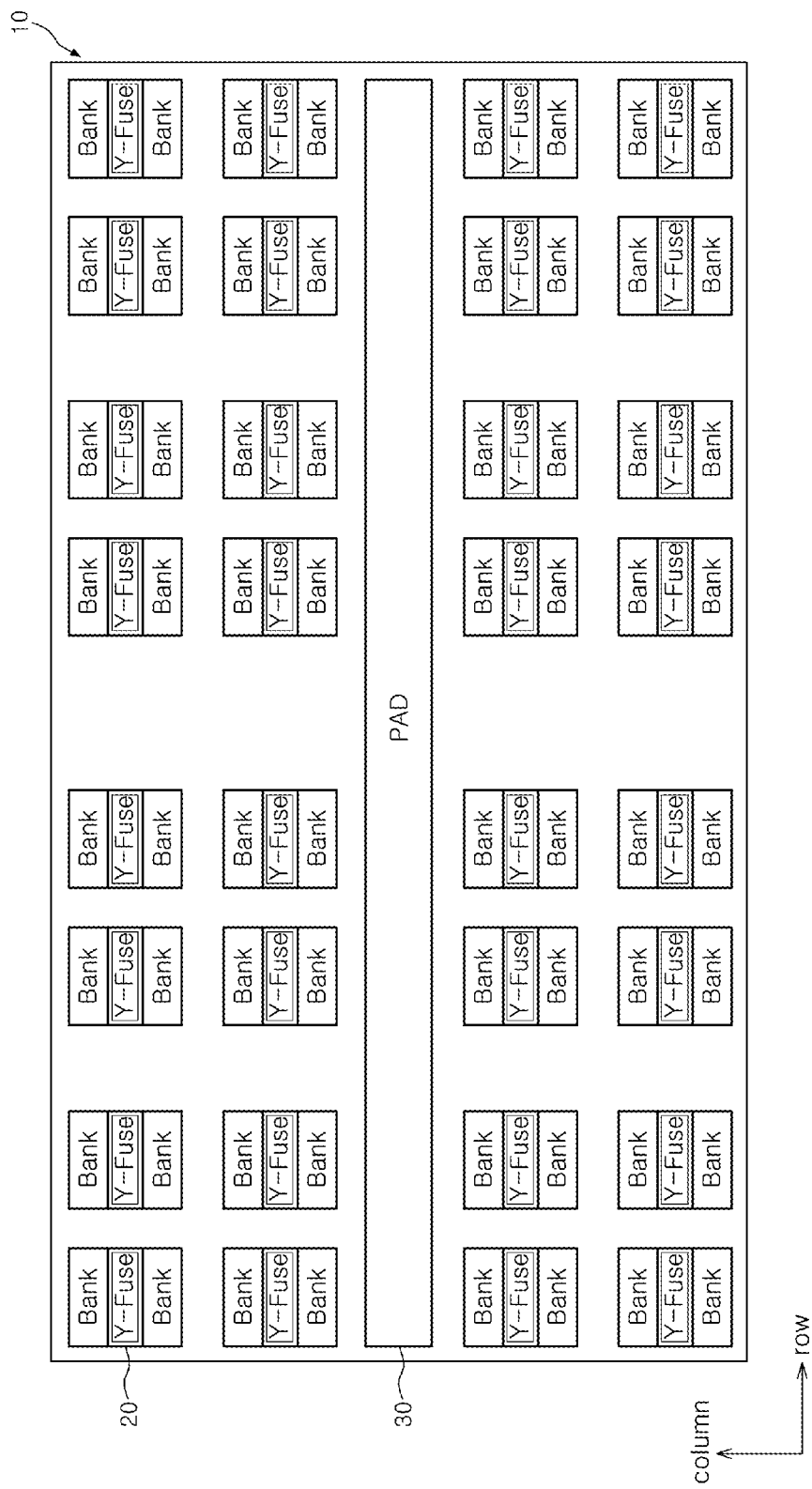
FIG. 1 is a plan view of a conventional semiconductor chip.
Figure 2:
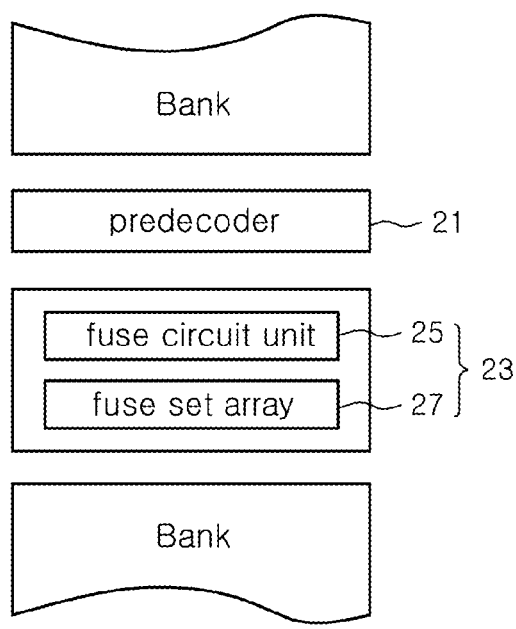
FIG. 2 is a block diagram of a conventional redundancy circuit unit of a semiconductor chip.
Figure 3:
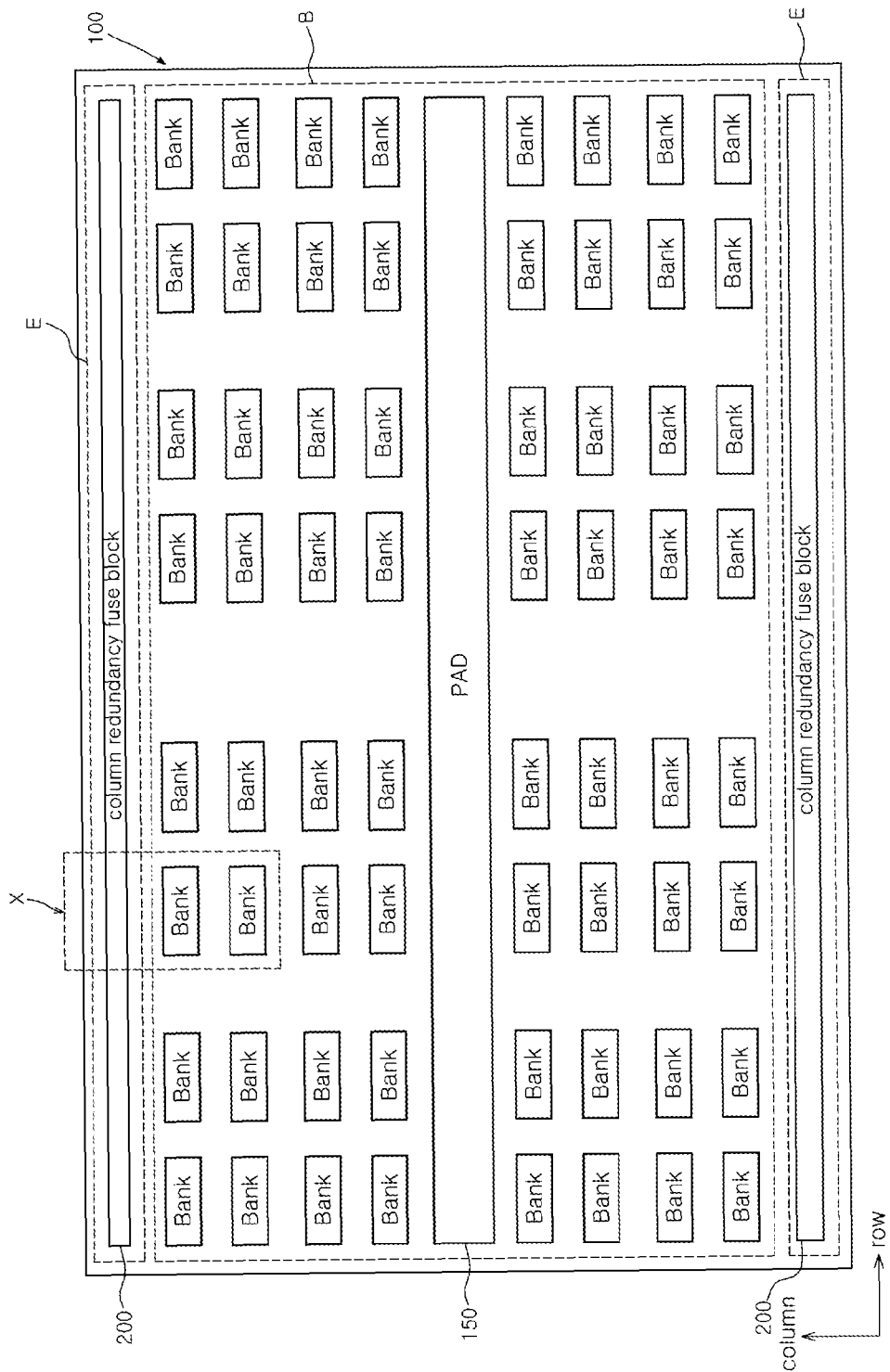
FIG. 3 is a plan view of an exemplary semiconductor chip according to one embodiment.

FIG. 3 is a plan view of an exemplary semiconductor chip according to one embodiment. In FIG. 3, a semiconductor chip 100 can be configured to include an edge area E and a bank area B located an inner portion of the edge area E.

The edge area E includes a column redundancy fuse block 200 to perform column redundancy operation. The bank area B can include a pad area 150 located at the center of the bank area B and a plurality of banks located in the bank area B along the row and column directions about the pad area 150. Here, the banks can be spaced apart from each other at a regular interval.

Figure 4:
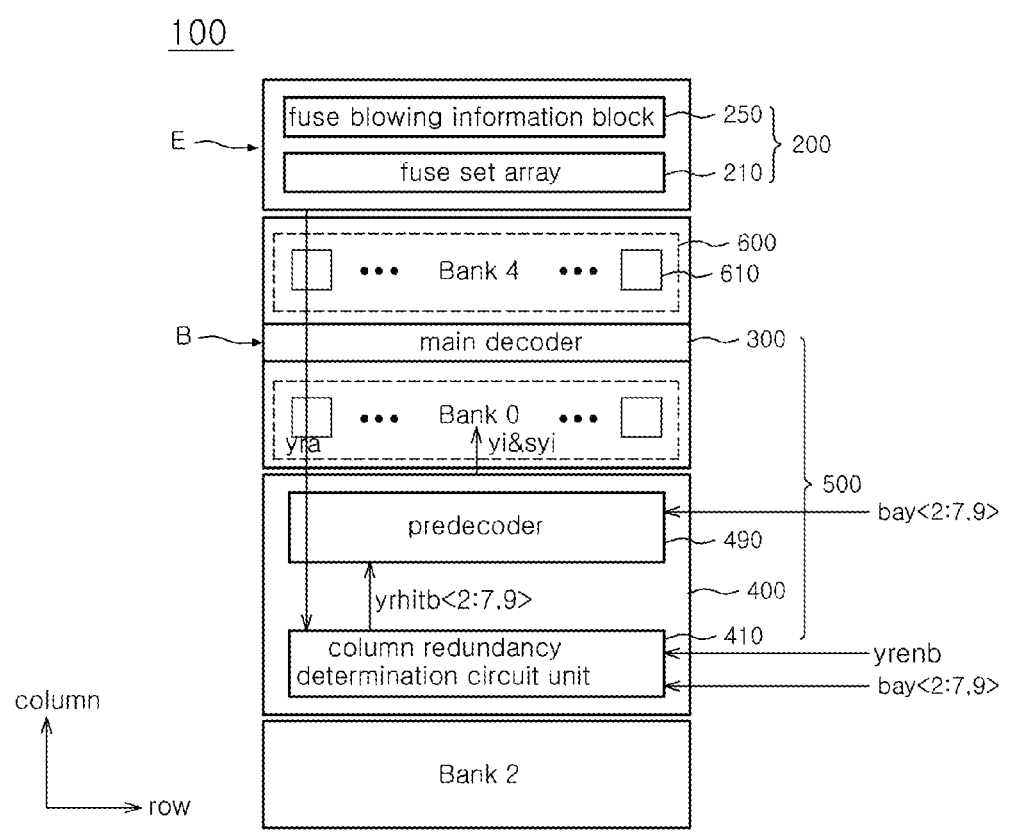
FIG. 4 is an enlarged block view of a portion "X" of FIG. 3 according to one embodiment.

FIG. 4 is an enlarged block view of a portion of FIG. 3 according to one embodiment. In FIG. 4, the column redundancy fuse block 200 can be disposed at the edge area E of the semiconductor chip 100 corresponding to an outer peripheral portion of the fourth bank 4, and a column control block 500 can be disposed in the bank area B between two banks adjacent to each other along the column direction.

The column redundancy fuse block 200 can include a fuse set array 210 and a fuse blowing information block 250. The column control block 500 can include first and second column control blocks 300 and 400 disposed in different regions between the banks. For example, the first and second column control blocks 300 and 400 can be alternatingly disposed between the banks along the column direction. Each of Banks may include a memory cell 600 array having a plurality of mats 610.

In addition, a main decoder (not shown) can be disposed in the first column control block 300, and a column redundancy determination circuit unit 410 and a predecoder 490 can be disposed in the second column control block 400.

Figure 5A:
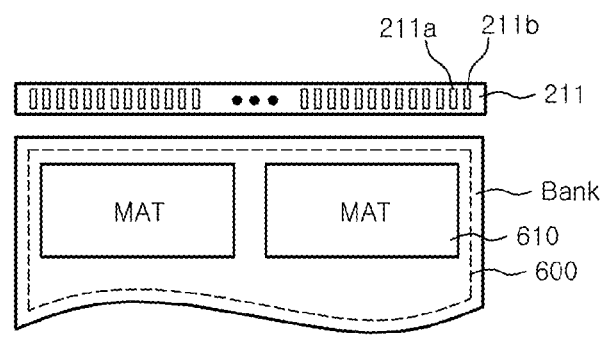
FIG. 5A is a plan view of an exemplary relation between a unit fuse set and a mat according to one embodiment.

FIG. 5A is a plan view of an exemplary relation between a unit fuse set and a mat according to one embodiment. In FIG. 5A, a fuse set is shown of the fuse set array 210 of the fuse block 200 (in FIG. 4). As shown in FIG. 5A, a unit fuse set 211 can be provided corresponding to two mats 610, which are adjacent to each other along the row direction, from among a plurality of mats 610 constituting the memory cell array 600. The unit fuse set 211 can include a plurality of fuse interconnections 211a and a pair of guard ring fuses 211b disposed at the edge area of the fuse interconnections 211a. Since the fuse set array 210 is disposed at the edge area E of the semiconductor chip, the fuse set 211 and fuse interconnections 211a constituting the fuse set 211 can have an alignment margin so the fuse interconnections 211a can be aligned along a single row.

In FIG. 4, if the fuse set array 210 is disposed at the edge area E of the semiconductor chip, then it is not necessary to consider the alignment and detouring of the interconnections, so that the fuse interconnections 211a and the fuse set 210 can be aligned along a row. Accordingly, the area of the column redundancy fuse block 200 can be significantly reduced.

Figure 5B:
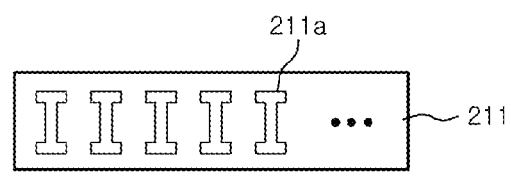
FIG. 5B is a plan view of an exemplary fuse set according to one embodiment.
Figure 5C:
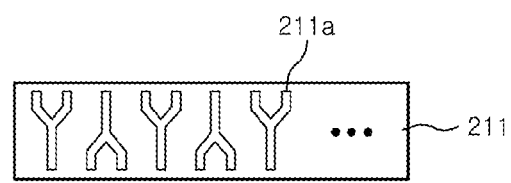
FIG. 5c is a plan view of another exemplary fuse set according to another embodiment.

FIGS. 5B and 5C are plan views of exemplary fuse sets according to different embodiments. In FIG. 5B, the fuse interconnections 211 may have one blowing area. In FIG. 5C, the fuse interconnections 211 may have a plurality of blowing areas.

Figure 6:
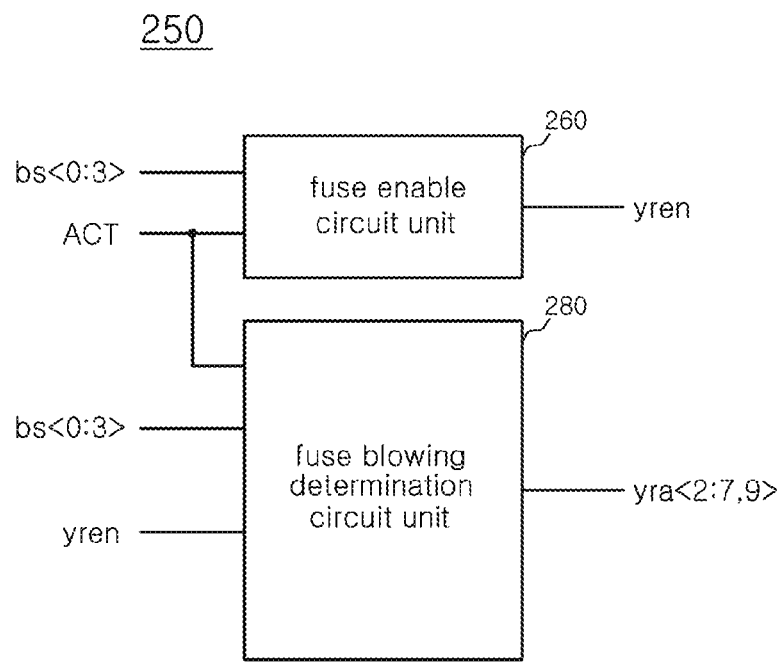
FIG. 6 is a block view of an exemplary fuse determination circuit block according to one embodiment.

FIG. 6 is a block view of an exemplary fuse determination circuit block according to one embodiment. In FIG. 6, the fuse blowing information block 250 can generate a fuse blowing determination signal 'yra' based on the blowing of the column address fuse. For example, the fuse blowing information block 250 can include a fuse enable circuit unit 260 and a fuse blowing determination circuit unit 280.

The fuse enable circuit unit 260 can receive control signals, such as a row active signal 'ACT' and a block selection signal 'bs<0:3>' having row information, to generate a fuse enable signal 'yren' for driving the fuse blowing determination circuit unit 280.

Figure 7:
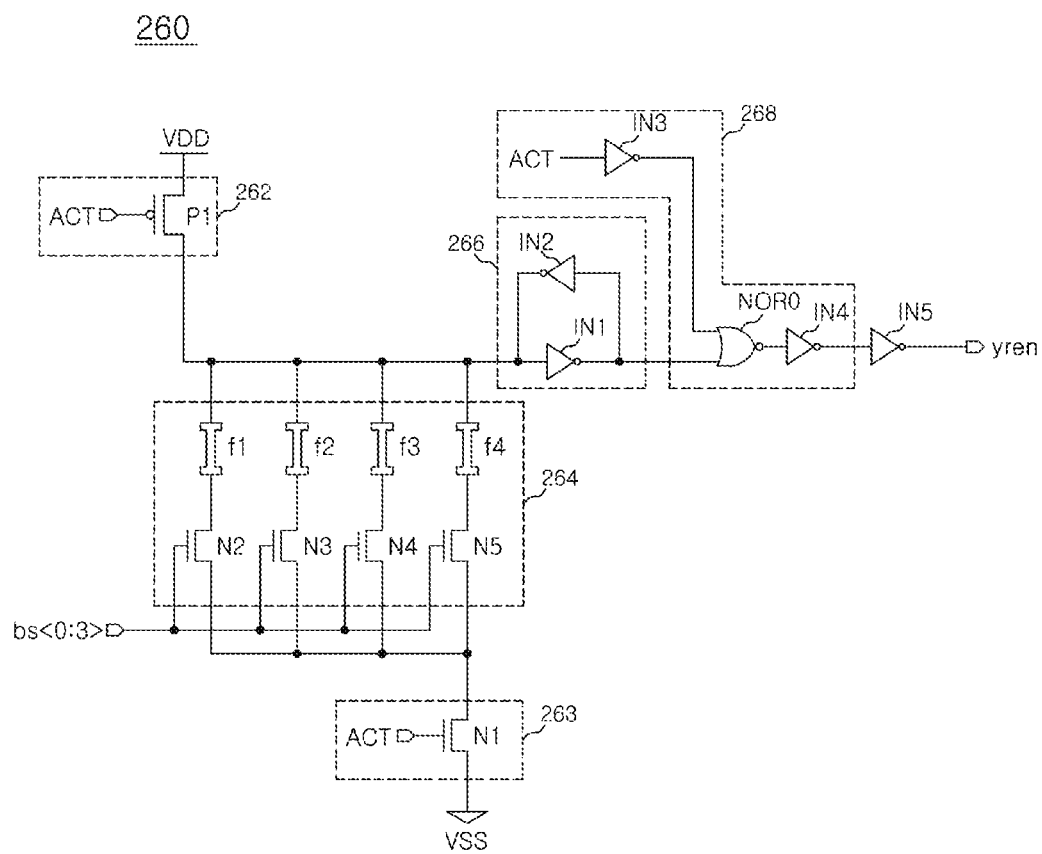
FIG. 7 is a schematic circuit of an exemplary fuse enable circuit unit according to one embodiment.

FIG. 7 is a schematic circuit of an exemplary fuse enable circuit unit according to one embodiment. In FIG. 7, the fuse enable circuit unit 260 can include a driving unit 262, a transfer unit 263, a fuse blowing checking unit 264, a latch unit 266, and an output unit 268.

The driving unit 262 can be configured to provide supply voltage VDD to the fuse blowing checking unit 264 according to the control signal, i.e., the row active signal 'ACT'. For example, the driving unit 262 can include a PMOS transistor P1.

The transfer unit 263 can discharge the voltage transmitted from the fuse blowing checking unit 264 to the ground according to the control signal, i.e., the row active signal 'ACT'. For example, the transfer unit 263 can include an NMOS transistor N1.

The fuse blowing checking unit 264 can include a plurality of column address fuses f1 to f4 and switching devices N2 to N5. Upon the blowing of one fuse, the fuse blowing checking unit 264 can generate a high signal. One end of the column address fuses f1 to f4 can be connected to the driving unit 262, and the switching devices N2 to N5 can correspond to the other end of the column address fuses f1 to f4. The switching devices N2 to N5 can include NMOS transistors, which can be selectively turned ON/OFF in response to the block selection signals 'bs<0:3>'. The switching devices N2 to N5 can be turned ON/OFF according to the enable status of the block selection signals 'bs<0:3>'. For example, the column address fuses f1 to f4 can have structures substantially similar to those shown in FIGS. 5B and/or 5C.

In FIG. 7, the latch unit 266 can latch the output signal of the fuse blowing checking unit 264. For example, the latch unit 266 can include first and second inverters IN1 and IN2.

The output unit 268 can enable the fuse enable signal 'yren' when the fuse blowing is detected by the fuse blowing checking unit 264 and the row active signal 'ACT' is enabled at the high level. For example, the output unit 268 can include a third inverter IN3, a NOR gate NOR0, a fourth inverter IN4, and a fifth inverter IN5.

The third inverter IN3 can invert the row active signal 'ACT', and the NOR gate NOR1 can receive the output signals of the latch unit 266 and the third inverter IN3 to perform the NOR operation. The fourth and fifth inverters IN4 and IN5 can be consecutively connected to generate the fuse enable signal 'yren' by amplifying the output signal of the NOR gate NOR1.

An exemplary operation of the fuse enable circuit unit 260 will be explained with reference to FIG. 7.

If the row active signal 'ACT' is enabled at the logic low level, then the driving unit 262 is driven so that the supply voltage VDD can be transferred to the fuse blowing checking unit 264. If one of the column address fuses f1 to f4 is blown and corresponding one of the switching devices N2 to N5 is turned ON, then the supply voltage VDD is not provided through the column address fuses f1 to f4 so that the fuse blowing checking unit 264 outputs the high signal. If all column address fuses f1 to f4 are not blown, then the supply voltage VDD can be provided to the transfer unit 163 through the column address fuses f1 to f4 and the corresponding switching devices N2 to N4, and can then discharge to the ground.

The latch unit 266 and the output unit 268 can output the fuse enable signal 'yren' by latching and buffering the output signal of the fuse blowing checking unit 264.

Figure 8:
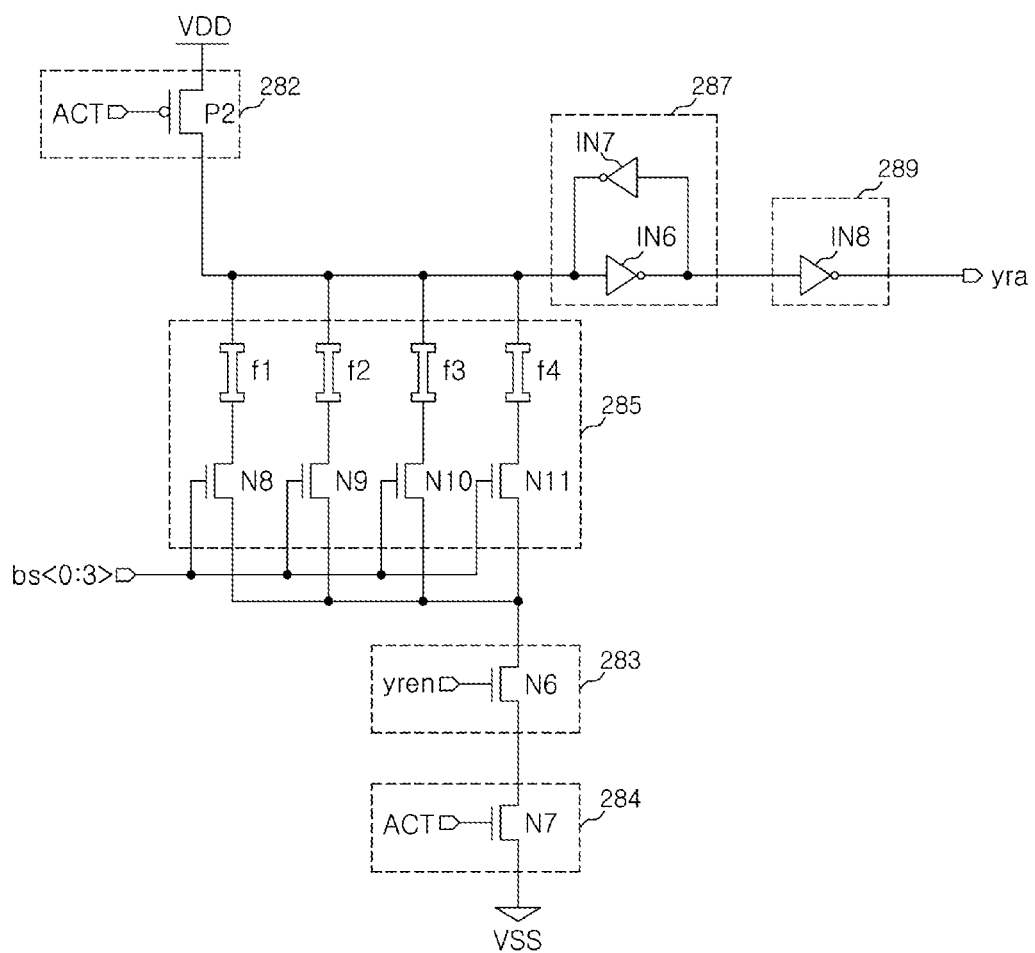
FIG. 8 is a schematic circuit of an exemplary fuse determination circuit unit according to one embodiment.

FIG. 8 is a schematic circuit of an exemplary fuse determination circuit unit according to one embodiment. In FIG. 8, the fuse blowing determination circuit unit 280 can generate the fuse blowing determination signal 'yra', which can be enabled at the low level, when the fuse enable signal 'yren' is enabled at the high level and one of the column address fuses f1 to f4 is blown.

For example, the fuse blowing determination circuit unit 280 can include a first driving unit 282, a second driving unit 283, a transfer unit 284, a fuse blowing checking unit 285, a latch unit 287, and an output unit 289.

The first driving unit 282 can be configured to provide supply voltage VDD to the fuse blowing checking unit 285 as the row active signal 'ACT' is enabled at the logic low. For example, the first driving unit 282 can include a PMOS transistor P2.

The second driving unit 283 can be configured to provide the voltage, which is supplied from the fuse blowing checking unit 285, to the transfer unit 284 as the fuse enable signal 'yren' is enabled. For example, the second driving unit 283 may include an NMOS transistor N6.

The transfer unit 284 can discharge the voltage transmitted from the second driving unit 283 to the ground Vss when the row active signal 'ACT' is logic high. For example, the transfer unit 284 can include an NMOS transistor N7.

The fuse blowing checking unit 285 can include circuit structures substantially the same as that of the fuse blowing checking unit 264 of the fuse enable circuit unit 260. For example, the fuse blowing checking unit 285 can include a plurality of column address fuses f1 to f4 and switching devices corresponding to the column address fuses f1 to f4, such as NMOS transistors N8 to N11.

The latch unit 287 can include two inverters IN6 and IN7, and the output unit 289 can include an inverter IN8 for inversely amplifying the output signal of the latch unit 287.

An exemplary operation of the fuse blowing determination circuit unit 280 will be made with reference to FIGS. 4 and 8.

If the row active signal 'ACT' is enabled at the logic low level and the fuse enable signal 'yren' is enabled at the high level, then the first and second driving units 282 and 283 can be driven. Accordingly, if one of the column address fuses f1 to f4 of the fuse blowing checking unit 285 is blown, then the supply voltage VDD is not provided to the transfer unit 284 so that the fuse blowing checking unit 285 outputs the high signal. The output signal of the fuse blowing checking unit 285 is output as the fuse blowing determination signal 'yra' by passing through the latch unit 287 and the output unit 289 having an inverse amplifying function.

In FIG. 4, the column redundancy determination circuit unit 410 of the second column control block 400 can compare the fuse blowing determination signal 'yra' with a column address signal 'bay<2:7,9>' to generate a repair selection signal 'yrhitb<2:7,9>' corresponding to each column. The predecoder 490 can receive the repair selection signal 'yrhitb<2:7,9>' and the column address signal 'bay<2:7,9>' from the column redundancy determination circuit unit 410 to generate a column selection signal 'Yi' or a spare column selection signal 'SYi'.

Figure 9:
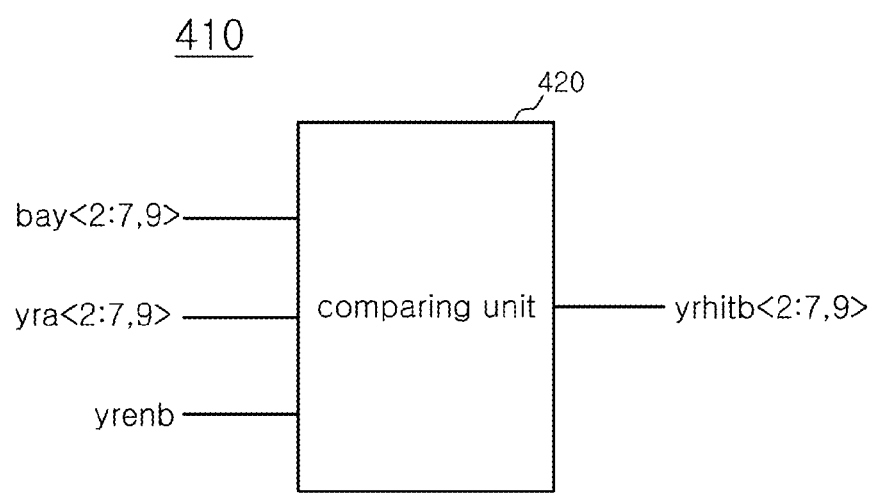
FIG. 9 is a block view of an exemplary column redundancy determination circuit unit according to one embodiment.

FIG. 9 is a block view of an exemplary column redundancy determination circuit unit according to one embodiment. In FIG. 9, the column redundancy determination circuit unit 410 can include a comparing unit 420 that can compare the column address signal 'bay<2:7,9>' with the fuse blowing determination signal 'yra<2:7,9>' by receiving the column address signal 'bay<2:7,9>', the fuse blowing determination signal 'yra<2:7,9>', and the inversed fuse enable signal 'yrenb', thereby generating the repair selection signal 'yrhitb<2:7,9>'. The comparing unit 420 can include sub-comparing units corresponding to the number of the fuse blowing determination signals 'yra<2:7,9>'.

Figure 10:
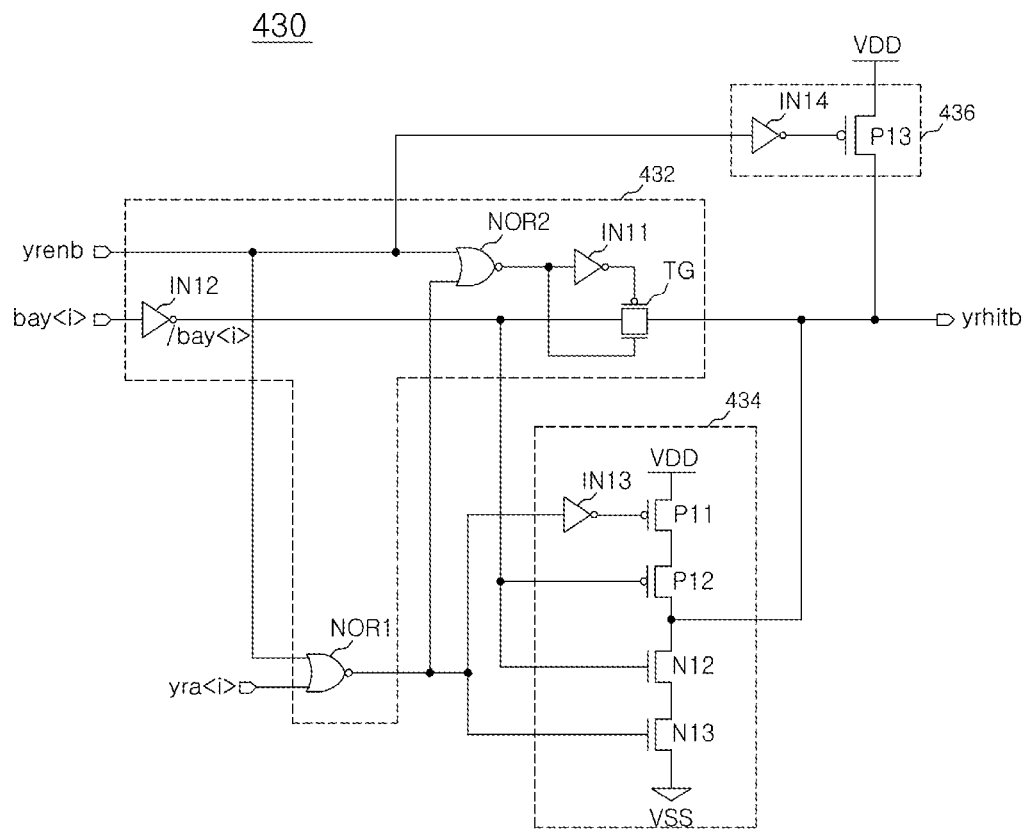
FIG. 10 is a schematic circuit of an exemplary sub-comparing unit constituting a column redundancy determination circuit unit of FIG. 9 according to one embodiment.

FIG. 10 is a schematic circuit of an exemplary sub-comparing unit constituting a column redundancy determination circuit unit of FIG. 9 according to one embodiment. In FIG. 10, the sub-comparing unit 430 can include a redundancy generator 432, a comparator 434, and a buffer 436.

The redundancy generator 432 can include a first NOR gate NOR1, a second NOR gate NOR2, a first inverter IN11, a second inverter IN12, and a transfer gate TG. The first NOR gate NOR1 can NOR-operate the inversed fuse enable signal 'yrenb' and the fuse blowing determination signal 'yra<i>, wherein i is 2 to 7 and 9', and the second NOR gate NOR2 can NOR-operate the inversed fuse enable signal 'yrenb' and the output signal of the first NOR gate NOR1. The first inverter IN11 can invert the output signal of the second NOR gate NOR2 to transfer the inverted output signal to the transfer gate TG. The transfer gate TG can transfer the column address signal '/bar<i>, wherein i is 2 to 7 and 9', which is inverted by the second inverter IN12, according to the output signals of the second NOR gate NOR2 and the first inverter IN11.

The comparator 434 can include a first PMOS transistor P11, a second PMOS transistor P12, a first NMOS transistor N12, a second NMOS transistor N13, and a third inverter IN13. The first PMOS transistor P11 can include a gate terminal receiving the output signal of the first NOR gate NOR1, which is inverted by the third inverter IN13, a drain terminal connected to the supply voltage VDD, and a source terminal connected to the second PMOS transistor P12.

The second PMOS transistor P12 can include a gate terminal receiving the inverted column address signal '/bay<i>', a drain terminal connected to the first PMOS transistor P11, and a source terminal connected to the first inverter IN11.

The first NMOS transistor N12 can include a gate terminal receiving the inversed column address signal '/bay<i>', a drain terminal connected to the second PMOS transistor P12, and a source terminal connected to the second NMOS transistor N13.

The second NMOS transistor N13 can include a gate terminal receiving the inversed output signal of the first NOR gate NOR1, a drain terminal connected to the first NMOS transistor N12, and a source terminal connected to a ground voltage terminal Vss.

The buffer 436 can include a fourth inverter IN14 for inverting the inverted fuse enable signal 'yrenb' and a third PMOS transistor P13 that can be selectively turned ON according to the output signal of the fourth inverter IN14 to transfer the supply voltage VDD.

When the inverted fuse enable signal 'yrenb' is enabled (activated) at the low level, if the column address signal 'bay<i>' is identical to the corresponding fuse blowing determination signal 'yra<i>', then the sub-comparing unit 430 can generate the repair selection signal 'yrhitb<i>' having the logic low level. In contrast, if the inverted fuse enable signal 'yrenb' is high or the column address signal 'bay<i>' is different from the fuse blowing determination signal 'yra<i>', then the sub comparing unit 430 can generate the repair selection signal 'yrhitb<i>' having the logic high level in order to confirm that the defect is not generated.

The repair selection signal 'yrhitb<i>' can be transferred to the predecoder 490. Accordingly, the predecoder 490 can selectively output the normal column selection signal 'Yi' or the spare column selection signal 'Syi' in response to the repair selection signal 'yrhitb<i>'.

Accordingly, the column redundancy fuse block 200 can include the fuse set array 210 disposed at the edge area of the semiconductor chip so that the fuse set array 210 can be aligned with a relatively large margin without considering the alignment of the interconnections, in particular, data input/output interconnections. Thus, the fuse set array 210 may not exist between the banks, so that the data input/output interconnections may extend in a straight line configuration, thereby improving the power mesh characteristics.

In addition, the column redundancy fuse block 200, which can be disposed at the edge area of the semiconductor chip, can be configured to have the fuse set array 210 and the fuse blowing information block 250, and the column redundancy determination circuit unit 410 can be configured to be positioned in the second column control block 400 between the banks. Although the column redundancy determination circuit unit 410 can be positioned in the column redundancy fuse block 200 located at the edge of the semiconductor chip, a time delay may occur if the column redundancy determination circuit unit 410 is positioned in the column redundancy fuse block 200.

Figure 11:
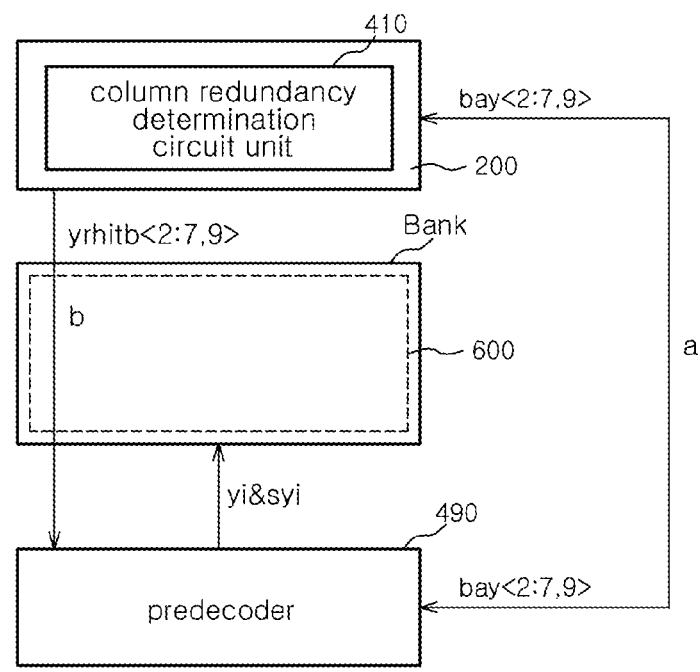
FIG. 11 is a block view of an exemplary main part of a semiconductor chip according to another embodiment.

FIG. 11 is a block view of an exemplary main part of a semiconductor chip according to another embodiment. In FIG. 11, a time (a) for inputting the column address signal 'bay<2:7,9>' into the column redundancy determination circuit unit 410, and a time (b) for transferring the repair selection signal 'yrhitb<2:7,9>' to the predecoder 490 through the memory cell array 600 of the bank are required. Thus, the access time tAA may be prolonged.

Accordingly, the column redundancy fuse block 200 can be disposed at the edge area of the semiconductor chip, and the column redundancy determination circuit unit 410, which receives the column address signal 'bay<2:7,9>' and directly communicates with the predecoder 490, can be installed in the second column control block 400 adjacent to the predecoder 490. Thus, the input delay of the column address signal 'bay<2:7,9>' and the repair selection signal 'yrhitb<2:7,9>' may rarely occur, so that the access time tAA can be shortened. In addition, although the fuse blowing determination signal 'yra' can be transferred from the fuse blowing information block 250 to the column redundancy determination circuit unit 410 through the memory cell array 600 of the bank, the fuse blowing determination signal 'yra' does not directly relate to the address, so it may not exert an influence upon the access time tAA.

Accordingly, the column redundancy fuse block including the fuse set array can be disposed at the outer peripheral potion of the bank. Thus, the interval between the banks constituting the semiconductor memory apparatus can be reduced, so that the effective net die area can be increased. In addition, the interconnections can be efficiently aligned, so that the crosstalk between the interconnections can be prevented and the signal delay can be prevented.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit having an edge area and a bank area located at an inner portion of the edge area, comprising:
   a column redundancy fuse block having a fuse set array having a plurality of fuse sets including a plurality of column address fuses; and
   a fuse blowing information block configured to output a fuse blowing determination signal of a corresponding column based on a cutting state of the column address fuses, wherein
   the column redundancy fuse block is disposed in the edge area,
   the fuse blowing determination signal is inputted to a column control block through an upper portion of a memory cell array included in each of a plurality of banks,
   the column control block is disposed in the bank area between the plurality of banks arranged along a column direction, and
   the column control block includes:
      a column redundancy determination circuit unit configured to receive the fuse blowing determination signal and a column address signal to generate a redundancy selection signal for determining a column address to be repaired; and
      a predecoder configured to receive the redundancy selection signal and the column address signal to provide one of a column selection signal and a spare column selection signal to a corresponding bank of the banks.

2. The semiconductor integrated circuit of claim 1, wherein the bank area includes the plurality of banks aligned along row and column directions while being spaced apart from each other by a predetermined distance.

3. The semiconductor integrated circuit of claim 1, wherein the fuse blowing information block includes:

a fuse enable circuit unit configured to generate a fuse enable signal according to a row information signal and the cutting state of the plurality of column address fuses; and a fuse blowing determination circuit unit configured to receive the fuse enable signal and the row information signal to generate the fuse blowing determination signal.

4. The semiconductor integrated circuit of claim 1, wherein the column redundancy fuse block is disposed in the edge area in the column direction.

5. The semiconductor integrated circuit of claim 1, wherein each of the plurality of banks includes a memory cell array having a plurality of mats arranged in a form of a matrix and spaced apart from each other by a predetermined distance along row and column directions.

6. The semiconductor integrated circuit of claim 5, wherein each of a plurality of unit fuse sets is correspondent to two of the plurality of mats that are adjacent to each other along the row direction.

7. The semiconductor integrated circuit of claim 1, wherein the plurality of fuse sets are arranged in parallel to each other.

8. The semiconductor integrated circuit of claim 1, wherein each of a plurality of unit fuse sets forms a single row in the fuse set array.

9. The semiconductor integrated circuit of claim 8, wherein the plurality of column address fuses are arranged in a line to form a single row.

10. The semiconductor integrated circuit of claim 1, wherein the fuse blowing information block includes a fuse enable circuit unit configured to generate a fuse enable signal that is enabled when one of the plurality of column address fuses is blown.

11. The semiconductor integrated circuit of claim 10, wherein the fuse blowing information block includes a fuse blowing determination circuit unit configured to generate the fuse blowing determination signal that is enabled when the fuse enable signal is enabled and one of the plurality of column address fuses is blown.

12. The semiconductor integrated circuit of claim 1, wherein the column redundancy determination circuit unit includes a comparing unit that compares the fuse blowing determination signal with the column address signal by an address.

13. The semiconductor integrated circuit of claim 1, wherein
the column control block includes a main decoder, and
the main decoder, the predecoder, and the column redundancy determination circuit unit are alternatingly disposed in different spaces defined by the plurality of banks arranged substantially parallel to each other along the column direction.

14. A semiconductor integrated circuit having an edge area and a bank area located at an inner portion of the edge area, comprising:
a plurality of banks being arranged in the bank area along row and column directions at a regular interval, wherein each of the banks includes a memory cell array;
a column redundancy fuse block having a fuse set array disposed in the edge area substantially parallel to the row direction and a fuse blowing information block for detecting fuse blowing information in the fuse set array; and
a column control block disposed in the bank area between the plurality of banks that are adjacent to each other along the column direction to output one of a column selection signal and a spare column selection signal by determining redundancy based on an output signal of the fuse blowing information block, wherein
the output signal of the fuse blowing information block is inputted to the column control block through upper portions of the memory cell array of a corresponding bank, and
the column control block includes:
a column redundancy determination circuit unit configured to receive the fuse blowing determination signal and a column address signal to generate a redundancy selection signal for determining a column address to be repaired; and
a predecoder configured to receive the redundancy selection signal and the column address signal to provide one of the column selection signal and the spare column selection signal to a corresponding bank of the banks.

15. The semiconductor integrated circuit of claim 14, wherein
the memory cell array includes a plurality of mats,
the fuse set array includes a plurality of fuse sets, and
each fuse set of the fuse set array is correspondent to two of the plurality of mats that are adjacent to each other along the row direction.

16. The semiconductor integrated circuit of claim 14, wherein the fuse blowing information block includes:
a fuse enable circuit unit configured to generate a fuse enable signal according to a block selection signal and a blowing of column address fuses when a row active signal is enabled; and
a fuse blowing determination circuit unit configured to receive the fuse enable signal and the block selection signal to generate the output signal of the fuse blowing information block when the row active signal is enabled.

17. A semiconductor integrated circuit, comprising:
an edge area having a column redundancy fuse block;
a first bank disposed at a lower portion of the edge area, wherein the first bank includes a memory cell array having a plurality of mats;
a first column control block disposed at a lower portion of the first bank;
a second bank disposed at a lower portion of the first column control block, wherein the second bank includes a memory cell array having a plurality of mats; and
a second column control block disposed at a lower portion of the second bank, wherein
the column redundancy fuse block includes:
a fuse set array having a plurality of fuse sets including a plurality of column address fuses; and
a fuse blowing information block configured to output a fuse blowing determination signal of a corresponding column based on a cutting state of the column address fuses, the fuse blowing determination signal is inputted to the second column control block through an upper portion of a memory cell array of a corresponding bank, and
the second column control block includes:
a column redundancy determination circuit unit configured to receive the fuse blowing determination signal and a column address signal to generate a redundancy selection signal for determining a column address to be repaired; and
a predecoder configured to receive the redundancy selection signal and the column address signal to provide one of a column selection signal and a spare column selection signal to a corresponding bank of the banks.

18. The semiconductor integrated circuit of claim 17, wherein the fuse blowing information block includes:
- a fuse enable circuit unit configured to generate a fuse enable signal according to a block selection signal and a blowing of the column address fuses when a row active signal is enabled; and
- a fuse blowing determination circuit unit configured to receive the fuse enable signal and the block selection signal to generate the fuse blowing determination signal when the row active signal is enabled.

* * * * *